(12) United States Patent
Shim et al.

(10) Patent No.: US 11,797,219 B2
(45) Date of Patent: Oct. 24, 2023

(54) STORAGE DEVICE, SERVER DEVICE INCLUDING THE STORAGE DEVICE AND METHOD OF OPERATING THE STORAGE DEVICE

(71) Applicant: SAMSUNG ELECTRONICS CO., LTD., Suwon-si (KR)

(72) Inventors: Young-Seop Shim, Seoul (KR); Kyung Duk Lee, Seoul (KR); Chan Moo Park, Seoul (KR); In Kap Chang, Suwon-si (KR); Jong-Sung Na, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/344,018

(22) Filed: Jun. 10, 2021

(65) Prior Publication Data
US 2022/0155994 A1    May 19, 2022

(30) Foreign Application Priority Data
Nov. 17, 2020    (KR) .................. 10-2020-0153813

(51) Int. Cl.
*G06F 3/06*    (2006.01)
(52) U.S. Cl.
CPC ............ *G06F 3/0655* (2013.01); *G06F 3/061* (2013.01); *G06F 3/0652* (2013.01); *G06F 3/0679* (2013.01)
(58) Field of Classification Search
CPC ...... G06F 3/0655; G06F 3/061; G06F 3/0652; G06F 3/0679
See application file for complete search history.

(56) References Cited

U.S. PATENT DOCUMENTS

| | | | |
|---|---|---|---|
| 8,947,928 B2 | 2/2015 | Kim et al. | |
| 9,330,790 B2 | 5/2016 | Kim et al. | |
| 9,500,535 B1* | 11/2016 | Urban | G01K 7/427 |
| 9,535,620 B2 | 1/2017 | Kim et al. | |
| 9,786,336 B2 | 10/2017 | Woo et al. | |
| 9,996,281 B2 | 6/2018 | Sharon et al. | |
| 10,446,217 B2 | 10/2019 | Park | |
| 10,509,583 B1* | 12/2019 | Hsiao | G06F 3/0616 |

(Continued)

FOREIGN PATENT DOCUMENTS

KR    10-2013-0072712 A    7/2013

*Primary Examiner* — Nanci N Wong
(74) *Attorney, Agent, or Firm* — Sughrue Mion, PLLC

(57) ABSTRACT

A storage device, a server device including the storage device and a method of operating the storage device are provided. The storage device includes a nonvolatile memory configured to store first control information related to a memory operation performed in a first temperature range and second control information related to a memory operation performed in a second temperature range different from the first temperature range, the first control information and the second control information being stored separately from each other, and a storage controller configured to receive a temperature sensed from a temperature sensor, determine a target temperature by processing the sensed temperature, select one of the first control information and the second control information based on the determined target temperature, and perform a memory operation on the nonvolatile memory using the selected control information.

20 Claims, 15 Drawing Sheets

222

| Temp | Operation Parameter | Defense Code |
|---|---|---|
| T0~T1 | OP1 | DC1 |
| T1~T2 | OP2 | DC2 |
| ⋮ | ⋮ | ⋮ |
| T(m-1)~Tm | OPm | DCm |

(56) References Cited

U.S. PATENT DOCUMENTS

| | | | |
|---|---|---|---|
| 10,656,875 B2 | 5/2020 | Hung | |
| 10,679,704 B2 | 6/2020 | Muchherla et al. | |
| 10,698,460 B2 | 6/2020 | Ping | |
| 2017/0285944 A1* | 10/2017 | Wang | G11C 7/04 |
| 2018/0090218 A1* | 3/2018 | Takada | G11C 16/0483 |
| 2018/0122484 A1* | 5/2018 | Jin | G06F 3/061 |
| 2018/0293029 A1* | 10/2018 | Achtenberg | G11C 29/028 |
| 2019/0265764 A1 | 8/2019 | Ping | |
| 2019/0278510 A1 | 9/2019 | Kaynak et al. | |
| 2020/0013470 A1* | 1/2020 | Nishikawa | G11C 29/52 |
| 2020/0073451 A1* | 3/2020 | Nowell | G06F 1/206 |
| 2020/0202938 A1 | 6/2020 | Reina | |
| 2020/0219568 A1* | 7/2020 | Tan | G06F 3/0659 |
| 2021/0073066 A1* | 3/2021 | Bielby | G06F 11/0739 |
| 2021/0081109 A1* | 3/2021 | Wang | G06F 3/0653 |
| 2021/0190362 A1* | 6/2021 | Ko | G06N 3/0445 |

\* cited by examiner

| Temp | Operation Parameter | Defense Code |
|---|---|---|
| T0~T1 | OP1 | DC1 |
| T1~T2 | OP2 | DC2 |
| ⋮ | ⋮ | ⋮ |
| T(m-1)~Tm | OPm | DCm |

| Temp | Compensation Imformation |
|------|--------------------------|
| T1   | CI1                      |
| T2   | CI2                      |
| ⋮    | ⋮                        |
| T(m-1) | CI(m-1)                |

| Current Temp \ Transition Temp | T1 | T2 | T3 | T4 |
|---|---|---|---|---|
| T1 | Offset 0 | Program offset + a mV<br>Read offset + a mV<br>Defense code offset + a mV | Program offset + b mV<br>Read offset + b mV<br>Defense code offset + b mV | Program offset + c mV<br>Read offset + c mV<br>Defense code offset + c mV |
| T2 | Program offset - a mV<br>Read offset - a mV<br>Defense code offset - a mV | Offset 0 | Program offset + a mV<br>Read offset + a mV<br>Defense code offset + a mV | Program offset + b mV<br>Read offset + b mV<br>Defense code offset + b mV |
| T3 | Program offset - b mV<br>Read offset - b mV<br>Defense code offset - b mV | Program offset - a mV<br>Read offset - a mV<br>Defense code offset - a mV | Offset 0 | Program offset + a mV<br>Read offset + a mV<br>Defense code offset + a mV |
| T4 | Program offset - c mV<br>Read offset - c mV<br>Defense code offset - c mV | Program offset - b mV<br>Read offset - b mV<br>Defense code offset - b mV | Program offset - a mV<br>Read offset - a mV<br>Defense code offset - a mV | Offset 0 |

STORAGE DEVICE, SERVER DEVICE INCLUDING THE STORAGE DEVICE AND METHOD OF OPERATING THE STORAGE DEVICE

CROSS-REFERENCE TO RELATED APPLICATION

This application claims priority from Korean Patent Application No. 10-2020-0153813 filed on Nov. 17, 2020 in the Korean Intellectual Property Office, and all the benefits accruing therefrom under 35 U.S.C. 119, the contents of which in its entirety are herein incorporated by reference.

BACKGROUND

1. Field

The present disclosure relates to a storage device, a server device including the storage device and a method of operating the storage device.

2. Description of the Related Art

In general, a large number of storage devices are applied to a server device. In recent server devices, the concept of server disaggregation is applied in which a sled is implemented by separating each function, and examples of such sleds are CPU sleds for a plurality of operations, network sleds for communication with other server devices, accelerator sleds for fast operation processing, and a plurality of storage sleds for data storage, and the like.

In order to improve the efficiency and reduce the cost of the server device, research has recently been conducted to integrate more storage devices into a storage sled unit. In this case, since the number of storage devices disposed in the storage sled unit increases, heat management of the storage device is emerging as a very important problem.

SUMMARY

It is an aspect to provide a storage device with improved operating performance.

It is another aspect to provide a server device with improved operating performance.

It is yet another aspect to provide a method of operating a storage device with improved operating performance.

According to an aspect of one or more embodiments, there is provided a storage device comprising a temperature sensor; a nonvolatile memory configured to store first control information related to a first temperature range and second control information related to a second temperature range different from the first temperature range; and a storage controller configured to receive a temperature sensed from the temperature sensor, determine a target temperature by processing the temperature, select one of the first control information and the second control information based on the target temperature, and perform a memory operation on the nonvolatile memory using the one of the first control information and the second control information.

According to another aspect of one or more embodiments, there is provided a server device comprising a first storage device disposed at a first position within the server device and including a first nonvolatile memory; a second storage device disposed at a second position within the server device different from the first position and including a second nonvolatile memory; and a first storage server including at least one of the first storage device and the second storage device, wherein the first storage device receives first control information related to a first temperature range and second control information related to a second temperature range different from the first temperature range, the first storage device includes a first storage controller configured to select one of the first control information and the second control information, and perform a memory operation on the first nonvolatile memory using the one of the first control information and the second control information selected by the first storage controller, the second storage device includes a second storage controller configured to receive the first control information and the second control information, select one of the first control information and the second control information, and perform a memory operation on the second nonvolatile memory using the one of the first control information and the second control information selected by the second storage controller, the first storage controller performs the memory operation on the first nonvolatile memory using the first control information, and the second storage controller performs the memory operation on the second nonvolatile memory using the second control information.

According to yet another aspect of one or more embodiments, there is provided a method of operating a storage device, the method comprising providing a nonvolatile memory configured to store first control information related to a first temperature range and second control information related to a second temperature range different from the first temperature range; receiving a temperature sensed from a temperature sensor; determining a target temperature by processing the temperature; selecting one of the first control information and the second control information based on the target temperature; and performing a memory operation on the nonvolatile memory using the one of the first control information and the second control information.

BRIEF DESCRIPTION OF THE DRAWINGS

The above and other aspects will become more apparent by describing in detail exemplary embodiments thereof with reference to the attached drawings, in which:

FIG. 4 is a diagram for describing control information of the data of FIG. 3;

FIGS. 6A and 6B are diagrams for describing a transition compensation table, according to some embodiments;

DETAILED DESCRIPTION

Various aspects discussed above are not restricted to those set forth herein. The above and other aspects will become more apparent to one of ordinary skill in the art to which the present disclosure pertains by referencing the detailed description of the present disclosure given below.

Hereinafter, embodiments of the present disclosure will be described with reference to the accompanying drawings.

Figure 1:
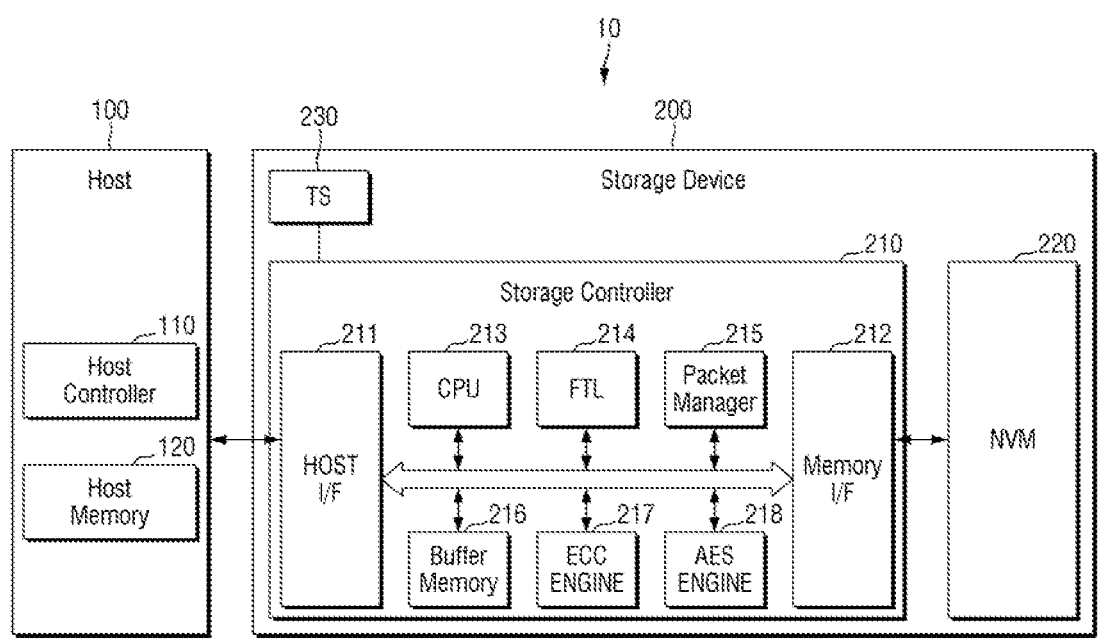
FIG. 1 is a block diagram illustrating a host-storage system according to some embodiments.

FIG. 1 is a block diagram illustrating a host-storage system according to some embodiments.

A host-storage system 10 may include a host 100 and a storage device 200. In some embodiments, the storage device 200 may include a storage controller 210 and a nonvolatile memory (NVM) 220. In some embodiments, the host 100 may include a host controller 110 and a host memory 120. The host memory 120 may function as a buffer memory for temporarily storing data to be transmitted to the storage device 200 or data transmitted from the storage device 200.

The storage device 200 may include storage media for storing data according to a request from the host 100. For example, the storage device 200 may be at least one of a solid state drive (SSD), an embedded memory, and a removable external memory. When the storage device 200 is an SSD, the storage device 200 may be a device conforming to the nonvolatile memory express (NVMe) standard.

When the storage device 200 is an embedded memory or an external memory, the storage device 200 may be a device conforming to universal flash storage (UFS) or embedded multi-media card (eMMC) standards. Each of the host 100 and the storage device 200 may generate and transmit a packet according to the adopted standard protocol.

When the nonvolatile memory 220 of the storage device 200 includes a flash memory, the flash memory may include a 2D NAND memory array or a 3D (or vertical) NAND (VNAND) memory array. As another example, the storage device 200 may include other various types of nonvolatile memories. For example, the storage device 200 may be applied with magnetic RAM (MRAM), spin-transfer torque MRAM, conductive bridging RAM (CBRAM), ferroelectric RAM (FeRAM), phase RAM (PRAM), resistive RAM, and various other types of memories.

In some embodiments, the host controller 110 and the host memory 120 may be implemented as separate semiconductor chips. Alternatively, in some embodiments, the host controller 110 and the host memory 120 may be integrated on the same semiconductor chip. As an example, the host controller 110 may be any one of a plurality of modules included in an application processor, and such an application processor may be implemented as a system on chip (SoC). In addition, the host memory 120 may be an embedded memory included in the application processor, or a nonvolatile memory or memory module disposed outside the application processor.

The host controller 110 may manage the operation of storing data (e.g., write data) of the buffer area in the nonvolatile memory 220 or storing data (e.g., read data) of the nonvolatile memory 220 in the buffer area.

The storage controller 210 may include a host interface (I/F) 211, a memory interface (I/F) 212, and a central processing unit (CPU) 213. In addition, the storage controller 210 may further include a flash translation layer (FTL) 214, a packet manager 215, a buffer memory 216, an error correction code (ECC) engine 217, and an advanced encryption standard (AES) engine 218.

The storage controller 210 may further include a working memory (not illustrated) into which the flash translation layer (FTL) 214 is loaded, and data write and read operations to the nonvolatile memory may be controlled by the CPU 213 executing the flash translation layer 214 loaded into the working memory.

The host interface (I/F) 211 may transmit and receive a packet to and from the host 100. The packet transmitted from the host 100 to the host interface 211 may include a command or data to be written to the nonvolatile memory 220, or the like, and the packet transmitted from the host interface 211 to the host 100 may include a response to the command, data read from the nonvolatile memory 220, or the like.

The memory interface (I/F) 212 may transmit data to be written to the nonvolatile memory (NVM) 220 to the nonvolatile memory (NVM) 220 or may receive data read from the nonvolatile memory (NVM) 220. Such memory interface 212 may be implemented to comply with standard conventions such as toggle or ONFI.

The flash translation layer (FTL) 214 may perform various functions such as address mapping, wear-leveling, and garbage collection. The address mapping operation denotes an operation of converting a logical address received from a host into a physical address used to actually store data in the nonvolatile memory 220. Wear-leveling denotes a technology for preventing excessive deterioration of a specific block by allowing the blocks in the nonvolatile memory 220 to be used evenly, and may be exemplarily implemented through a firmware technology that balances erase counts of physical blocks. Garbage collection denotes a technology for securing usable capacity in the nonvolatile memory 220 by copying valid data of a block to a new block and then erasing the existing block.

The packet manager 215 may generate a packet according to a protocol of an interface negotiated with the host 100, or may parse various types of information from a packet received from the host 100. In addition, the buffer memory 216 may temporarily store data to be written to the nonvolatile memory 220 or data to be read from the nonvolatile memory 220. The buffer memory 216 may be configured to be provided in the storage controller 210, but may be disposed outside the storage controller 210.

The ECC engine 217 may perform an error detection and correction function for the read data read from the nonvolatile memory 220. More specifically, the ECC engine 217 may generate parity bits for write data to be written to the nonvolatile memory 220, and the parity bits generated as described above may be stored in the nonvolatile memory 220 together with the write data. When reading data from the nonvolatile memory 220, the ECC engine 217 may correct the error of the read data using the parity bits read from the nonvolatile memory 220 together with the read data, and may output the read data in which the error is corrected.

The AES engine 218 may perform at least one of an encryption operation or a decryption operation for data inputted to the storage controller 210 using a symmetric-key algorithm.

The storage device 200 may further include a temperature sensor (TS) 230. The temperature sensor 230 may sense the temperature of the storage device 200 and provide the sensed temperature as sensed temperature information to the storage controller 210. Specifically, the temperature sensor 230 may sense an operating temperature of the storage device 200 and/or a temperature of the surrounding environment of the storage device 200, or the like, and may provide the operating temperature and/or the temperature of the surrounding environment as the sensed temperature information to the storage controller 210.

Figure 2:
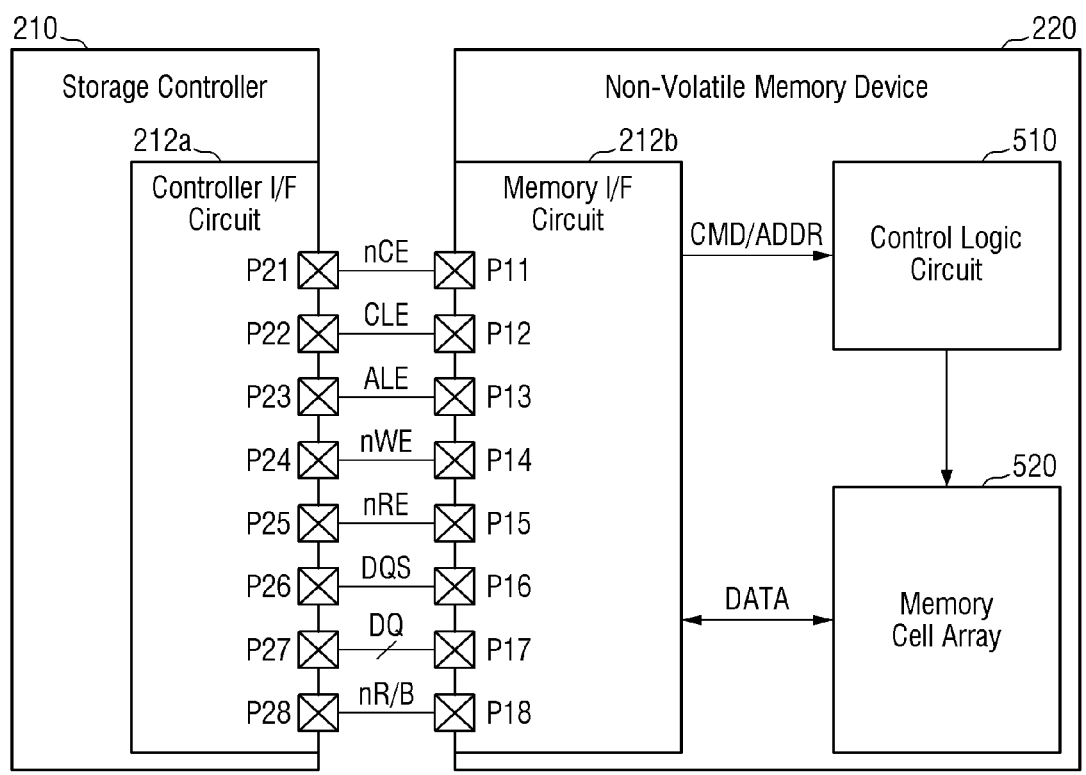
FIG. 2 is a diagram illustrating a configuration of a storage controller, a memory interface, and a nonvolatile memory of the host-storage system of FIG. 1.

FIG. 2 is a diagram illustrating a configuration of a storage controller, a memory interface, and a nonvolatile memory of the host-storage system of FIG. 1. The memory interface (I/F) 212 of FIG. 1 may include a controller interface (I/F) circuit 212a and the nonvolatile memory (NVM) 220 of FIG. 1 may include a memory interface (I/F) circuit 212b of FIG. 2.

The nonvolatile memory (NVM) 220 may include first to eighth pins P11 to P18, the memory interface circuit 212b, a control logic circuit 510, and a memory cell array 520.

The memory interface (I/F) circuit 212b may receive a chip enable signal nCE from the storage controller 210 through the first pin P11. The memory interface circuit 212b may transmit and receive signals to and from the storage controller 210 through the second to eighth pins P12 to P18 according to the chip enable signal nCE. For example, when the chip enable signal nCE is in an enable state (e.g., a low level), the memory interface circuit 212b may transmit and receive signals to and from the storage controller 210 through the second to eighth pins P12 to P18.

The memory interface (I/F) circuit 212b may receive a command latch enable signal CLE, an address latch enable signal ALE, and a write enable signal nWE from the storage controller 210 through the second to fourth pins P12 to P14, respectively. The memory interface circuit 212b may receive a data signal DQ from the storage controller 210 through the seventh pin P17 or transmit the data signal DQ to the storage controller 210. A command CMD, an address ADDR, and data may be transmitted through the data signal DQ. For example, the data signal DQ may be transmitted through a plurality of data signal lines. In this case, the seventh pin P17 may include a plurality of pins corresponding to a plurality of data signals.

The memory interface (I/F) circuit 212b may obtain the command CMD from the data signal DQ received in an enable interval (e.g., a high level state) of the command latch enable signal CLE based on toggle timings of the write enable signal nWE. The memory interface circuit 212b may obtain the address ADDR from the data signal DQ received in an enable interval (e.g., a high level state) of the address latch enable signal ALE based on toggle timings of the write enable signal nWE.

In some embodiments, the write enable signal nWE may be toggled between a high level and a low level while maintaining a static state (e.g., a high level or a low level). For example, the write enable signal nWE may be toggled in an interval in which the command CMD or the address ADDR is transmitted. Accordingly, the memory interface circuit 212b may obtain the command CMD or the address ADDR based on the toggle timings of the write enable signal nWE.

The memory interface (I/F) circuit 212b may receive a read enable signal nRE from the storage controller 210 through the fifth pin P15. The memory interface circuit 212b may receive a data strobe signal DQS from the storage controller 210 through the sixth pin P16 or transmit the data strobe signal DQS to the storage controller 210.

In the output operation of the data DATA of the nonvolatile memory 220, the memory interface circuit 212b may receive the read enable signal nRE toggling through the fifth pin P15 before outputting the data DATA. The memory interface circuit 212b may generate the data strobe signal DQS toggling based on toggling of the read enable signal nRE. For example, the memory interface circuit 212b may generate the data strobe signal DQS that starts toggling after a predetermined delay (e.g., tDQSRE) based on the toggling start time of the read enable signal nRE. The memory interface circuit 212b may transmit the data signal DQ including the data DATA based on a toggle timing of the data strobe signal DQS. Accordingly, the data DATA may be aligned with the toggle timing of the data strobe signal DQS and transmitted to the storage controller 210.

When the data signal DQ including the data DATA is received from the storage controller 210 in the input operation of the data DATA of the nonvolatile memory 220, the memory interface circuit 212b may receive the data strobe signal DQS toggling together with the data DATA from the storage controller 210. The memory interface circuit 212b may acquire the data DATA from the data signal DQ based on the toggle timing of the data strobe signal DQS. For example, the memory interface circuit 212b may obtain the data DATA by sampling the data signal DQ at the rising and falling edges of the data strobe signal DQS.

The memory interface (I/F) circuit 212b may transmit a ready/busy output signal nR/B to the storage controller 210 through the eighth pin P18. The memory interface circuit 212b may transmit state information of the nonvolatile memory 220 to the storage controller 210 through the ready/busy output signal nR/B. When the nonvolatile memory 220 is in a busy state (that is, when internal operations of the nonvolatile memory 220 are being performed), the memory interface circuit 212b may transmit the ready/busy output signal nR/B indicating a busy state to the storage controller 210. When the nonvolatile memory 220 is in a ready state (that is, when internal operations of the nonvolatile memory 220 are not performed or completed), the memory interface circuit 212b may transmit the ready/busy output signal nR/B indicating a ready state to the storage controller 210.

For example, when the nonvolatile memory (NVM) 220 reads the data DATA from the memory cell array 520 in response to a page read command, the memory interface circuit 212b may transmit the ready/busy output signal nR/B indicating a busy state (e.g., a low level) to the storage controller 210. For example, when the nonvolatile memory 220 programs the data DATA into the memory cell array 520 in response to a program command, the memory interface circuit 212b may transmit the ready/busy output signal nR/B indicating a busy state to the storage controller 210.

The control logic circuit 510 may overall control various operations of the nonvolatile memory 220. The control logic circuit 510 may receive the command/address CMD/ADDR obtained from the memory interface circuit 212b. The control logic circuit 510 may generate control signals for controlling other components of the nonvolatile memory 220 according to the received command/address CMD/ADDR. For example, the control logic circuit 510 may generate various control signals for programming the data DATA in the memory cell array 520 or reading the data DATA from the memory cell array 520.

The memory cell array 520 may store the data DATA obtained from the memory interface circuit 212b under the control of the control logic circuit 510. The memory cell array 520 may output the stored data DATA to the memory interface circuit 212b under the control of the control logic circuit 510.

The memory cell array 520 may include a plurality of memory cells. For example, the plurality of memory cells may be flash memory cells. However, embodiments are not limited thereto, and the memory cells may include resistive random access memory (RRAM) cells, ferroelectric random access memory (FRAM) cells, phase change random access memory (PRAM) cells, thyristor random access memory (TRAM) cell, and magnetic random access memory (MRAM) cells, or the like. Hereinafter, embodiments will be described focusing on an embodiment in which the memory cells are NAND flash memory cells.

The storage controller 210 may include first to eighth pins P21 to P28 and the controller interface (I/F) circuit 212a. The first to eighth pins P21 to P28 may correspond respectively to the first to eighth pins P11 to P18 of the nonvolatile memory 220.

The controller interface (I/F) circuit 212a may transmit the chip enable signal nCE to the nonvolatile memory 220 through the first pin P21. The controller interface circuit 212a may transmit and receive signals to and from the nonvolatile memory 220 selected through the chip enable signal nCE through the second to eighth pins P22 to P28.

The controller interface (I/F) circuit 212a may transmit the command latch enable signal CLE, the address latch enable signal ALE, and the write enable signal nWE to the nonvolatile memory 220 through the second to fourth pins P22 to P24. The controller interface circuit 212a may transmit the data signal DQ to the nonvolatile memory 220 through the seventh pin P27 or may receive the data signal DQ from the nonvolatile memory 220.

The controller interface (I/F) circuit 212a may transmit the data signal DQ including the command CMD or the address ADDR to the nonvolatile memory 220 together with the write enable signal nWE to be toggled. The controller interface circuit 212a may transmit the data signal DQ including the command CMD to the nonvolatile memory 220 as the command latch enable signal CLE having an enable state is transmitted, and may transmit the data signal DQ including the address ADDR to the nonvolatile memory 220 as the address latch enable signal ALE having an enable state is transmitted.

The controller interface (I/F) circuit 212a may transmit the read enable signal nRE to the nonvolatile memory 220 through the fifth pin P25. The controller interface circuit 212a may receive the data strobe signal DQS from the nonvolatile memory 220 or transmit the data strobe signal DQS to the nonvolatile memory 220, through the sixth pin P26.

In the output operation of the data DATA of the nonvolatile memory 220, the controller interface circuit 212a may generate the read enable signal nRE toggling, and transmit the read enable signal nRE to the nonvolatile memory 220. For example, the controller interface circuit 212a may generate the read enable signal nRE that changes from a fixed state (e.g., a high level or a low level) to a toggle state before the data DATA is outputted. Accordingly, the data strobe signal DQS that toggles based on the read enable signal nRE may be generated in the nonvolatile memory 220. The controller interface circuit 212a may receive the data signal DQ including the data DATA together with the data strobe signal DQS toggling from the nonvolatile memory 220. The controller interface circuit 212a may obtain the data DATA from the data signal DQ based on the toggle timing of the data strobe signal DQS.

In the input operation of the data DATA of the nonvolatile memory 220, the controller interface circuit 212a may generate the data strobe signal DQS toggling. For example, the controller interface circuit 212a may generate the data strobe signal DQS that changes from a fixed state (e.g., a high level or a low level) to a toggle state before transmitting the data DATA. The controller interface circuit 212a may transmit the data signal DQ including the data DATA to the nonvolatile memory 220 based on toggle timings of the data strobe signal DQS.

The controller interface (I/F) circuit 212a may receive the ready/busy output signal nR/B from the nonvolatile memory 220 through the eighth pin P28. The controller interface circuit 212a may determine state information of the nonvolatile memory 220 based on the ready/busy output signal nR/B.

Figure 3:
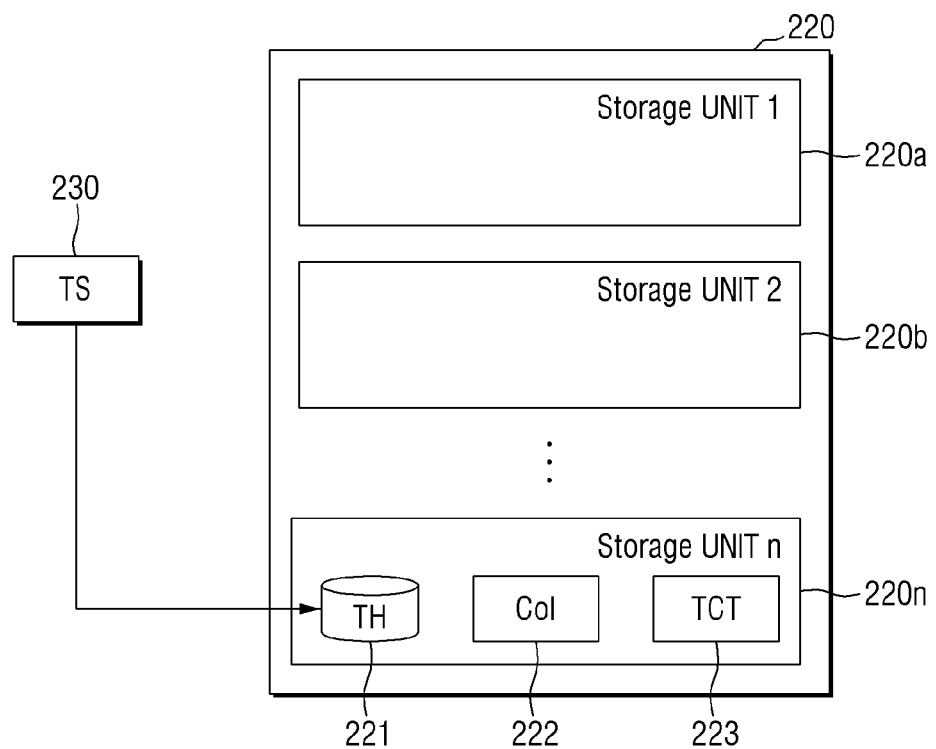
FIG. 3 is a diagram for describing data stored in the nonvolatile memory of the host-storage system of FIG. 1.
Figure 5:
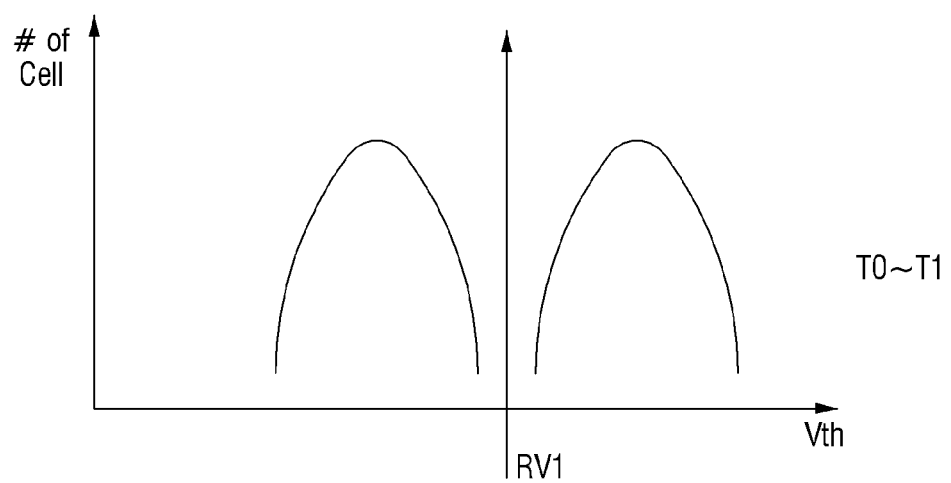
FIG. 5 is a diagram for describing operation parameters of the control information of FIG. 4.
Figure 5:
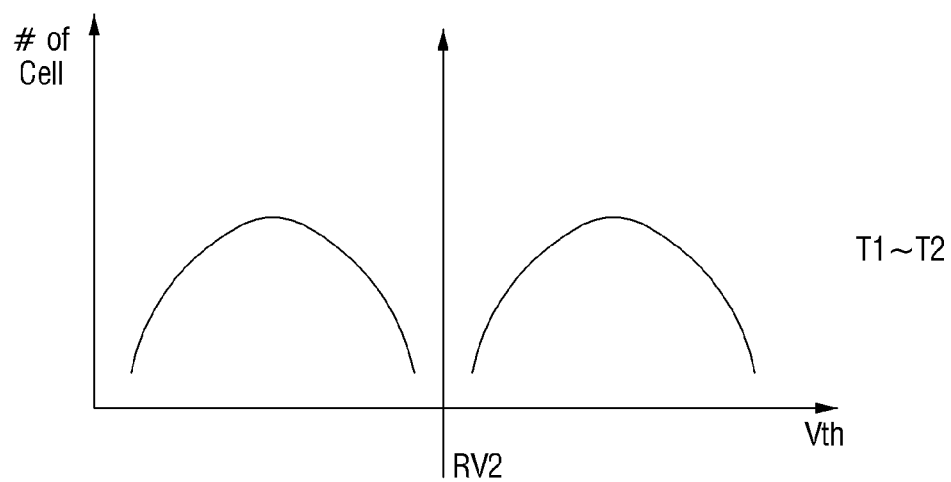

FIG. 3 is a diagram for describing data stored in the nonvolatile memory of the host-storage system of FIG. 1. FIG. 4 is a diagram for describing control information of the data of FIG. 3. FIG. 5 is a diagram for describing operation parameters of the control information of FIG. 4. FIGS. 6A and 6B are diagrams for describing a transition compensation table, according to embodiments.

Referring to FIG. 3, the nonvolatile memory 220 may include a plurality of storage units 220a to 220n. In some embodiments, each of the storage units 220a to 220n may include a flash memory. In this case, the flash memory may include a 2D NAND memory array or a 3D (or vertical) NAND (VNAND) memory array. In some other embodiments, each of the storage units 220a to 220n may include, for example, MRAM, spin transfer torque MRAM, conductive bridging RAM, FeRAM, PRAM, resistive memory, or the like.

Among the plurality of storage units 220a to 220n, one of the plurality of storage units 220a to 220n, for example, the storage unit 220n in the embodiment illustrated in FIG. 3, may include a temperature history (TH) 221, control information (CoI) 222, and a transition compensation table (TCT) 223. Although the drawing illustrates a configuration in which the temperature history 221, the control information 222, and the transition compensation table 223 are all stored in the storage unit 220n, embodiments are not limited thereto. In some embodiments, each of the temperature history 221, the control information 222, and the transition compensation table 223 may be stored in different storage units among the plurality of storage units 220a to 220n. In some embodiments, the temperature history 221, the control information 222 and the transition compensation table 223 may be stored in each of the plurality of storage units 220a to 220n.

The storage unit from among the plurality of storage units 220a to 220n in which the temperature history 221, the control information 222, and the transition compensation table 223 are stored may be specified by the storage controller 210. That is, the storage controller 210 may know which storage unit of the plurality of storage units 220a to 220n stores the temperature history 221, the control information 222, and the transition compensation table 223.

Figure 10:
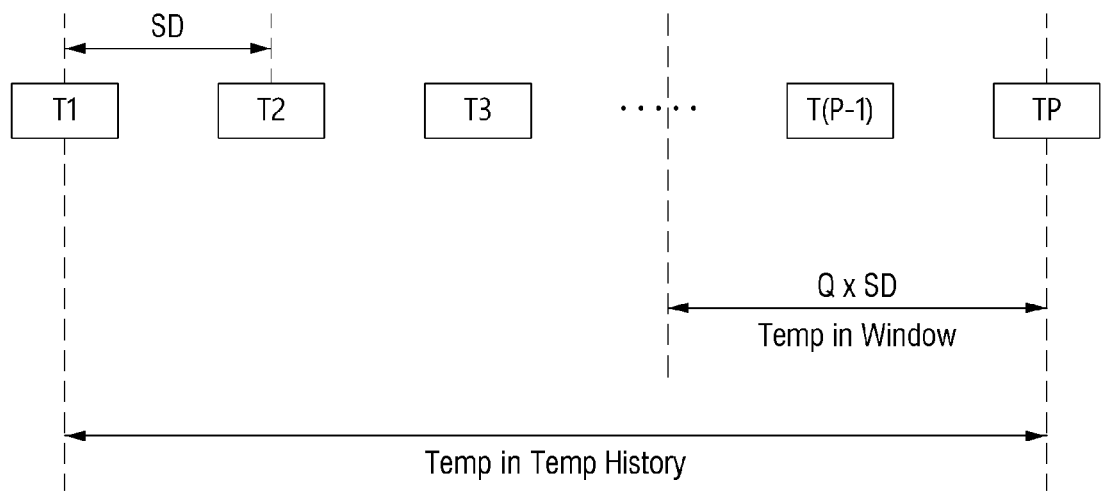
FIG. 10 is a diagram for describing a process of determining a target temperature, according to some embodiments.

The temperature history (TH) 221 may receive and store the temperature (or temperature information) sensed from the temperature sensor 230. That is, in the temperature history 221, as illustrated in FIG. 10 to be described in more detail below, temperatures (T1 to TP, where P is a natural number) sensed by the temperature sensor 230 for each sensing period SD may be accumulated and stored.

The control information (CoI) 222 may include information related to a memory operation performed in a specific temperature range. The memory operation may include one or more of a read operation in which the storage controller 210 reads data stored in the nonvolatile memory 220, a write operation in which the storage controller 210 writes data to the nonvolatile memory 220, and an erase operation in which the storage controller 210 erases at least a part of the nonvolatile memory 220, but embodiments are not limited thereto.

That is, the control information 222 may include information related to a read operation performed in a specific temperature range, information related to a write operation performed in a specific temperature range, and/or information related to an erase operation performed in a specific temperature range, but embodiments are not limited thereto.

Specifically, referring to FIG. 4, the control information 222 may include an operation parameter OP for determining a memory operation performed in a specific temperature range and a defense code DC for optimizing a memory operation.

In some embodiments, the control information 222 may include m (where m is a natural number) temperature ranges, and operation parameters OP1 to OPm and defense codes DC1 to DCm, corresponding to the respective temperature ranges.

For example, an operation parameter OP1 and a defense code DC1 may be the operation parameter and the defense code that are used when the storage device performs a memory operation in the temperature range T0 to T1, an operation parameter OP2 and a defense code DC2 may be the operation parameter and the defense code that are used when the storage device performs a memory operation in the temperature range T1 to T2, and an operation parameter OPm and a defense code DCm may be the operation parameter and the defense code that are used when the storage device performs a memory operation in the temperature range T(m−1) to Tm.

In some embodiments, the operation parameter OP may include a read level voltage for sensing data stored in a memory cell.

Referring to FIG. 5, the distribution of the memory cells in the temperature range T0 to T1 and the distribution of the memory cells in the temperature range T1 to T2 may be different from each other. Accordingly, when the same read level voltage is used in a case where the storage device operates in the temperature range T0 to T1 and in a case where the storage device operates in the temperature range T1 to T2, a read failure is likely to occur. Accordingly, the operating parameter OP1 of the temperature range T0 to T1 may include a first read level voltage RV1, and the operating parameter OP2 of the temperature range T1 to T2 may include a second read level voltage RV2.

The read level voltage is provided as an example of the operation parameter OP, but embodiments are not limited thereto. The operation parameter OP may include other information (not illustrated) that determines a memory operation performed in a specific temperature range.

The defense code DC may include an algorithm for optimizing a memory operation performed in a specific temperature range. Such an example may include a read-retry algorithm or the like, but embodiments are not limited thereto.

The transition compensation table (TCT) 223 may include compensation information for compensating a memory operation when the storage device transitions from operating in the first temperature range to operating in the second temperature range.

Specifically, referring to FIG. 6A, the transition compensation table 223 may include compensation information CI1 to CI(m−1) according to the temperature T1 to T(m−1) at which the transition has occurred. The compensation information CI may include, for example, temperature information corresponding to data, an operation parameter used for compensation, a defense code used for compensation, or the like, but embodiments are not limited thereto.

For example, when data is written to the nonvolatile memory 220 in the temperature range T0 to T1 and the operation of reading the written data is to be performed in the temperature range T1 to T2, the compensation information CI may include information (e.g., information on a change in a read level voltage, information on a change in a read-retry algorithm, or the like) for improving the reliability of such a read operation. For example, the transition compensation table may include compensation information CI1 corresponding to a transition from the temperature range T0 to T1 to the temperature range T1 to T2.

Specifically, referring to FIG. 6B, the transition compensation table 223 may include offset values for compensating a memory operation when the storage device transitions from operating in the first temperature range to operating in the second temperature range.

For example, when the target temperature of the storage device operating at T1 is changed to T2, an offset of a millivolts (mV) may be added as a program offset, a read offset, and a defense code offset. When the target temperature of the storage device operating at T1 is changed to T3, an offset of b mV may be added as a program offset, a read offset, and a defense code offset. When the target temperature of the storage device operating at T1 is changed to T4, an offset of c mV may be added as a program offset, a read offset, and a defense code offset.

Conversely, when the target temperature of the storage device operating at T4 is changed to T3, an offset of a mV may be reduced as a program offset, a read offset, and a defense code offset. The transition compensation table 223 may store offset values according to a change in operating temperature as described above.

In the above description, only an example in which the control information 222 and the transition compensation table 223 are stored in the nonvolatile memory 220 has been described, but embodiments are not limited thereto. For example, in some embodiments, the control information 222 and the transition compensation table 223 may be stored in a storage area (e.g., a cloud storage or the like) other than the nonvolatile memory 220, and the storage controller 210 may use the control information and the transition compensation table that have been provided through, for example, a network or the like. In addition, in some embodiments, the storage controller 210 may receive the control information 222 and the transition compensation table 223 through, for example, a network or the like, may store the control information and the transition compensation table in the nonvolatile memory of the storage device 200 such as the buffer memory 216, and then may use the control information and the transition compensation table.

Figure 7:
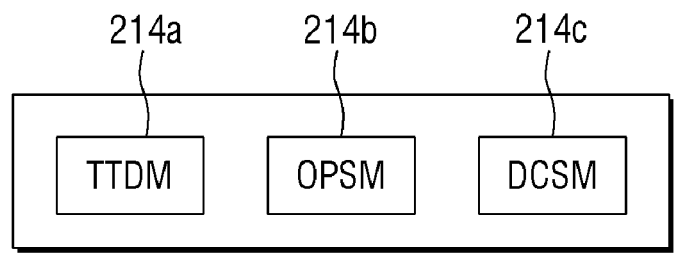
FIG. 7 is a diagram for describing a flash translation layer (FTL) of the host-storage system of FIG. 1.

FIG. 7 is a diagram for describing the flash translation layer (FTL) of the host-storage system of FIG. 1.

Referring to FIGS. 1 and 7, the flash translation layer 214 of the storage controller 210 may include a target temperature determination module (TTDM) 214a, an operation parameter selection module (OPSM) 214b, and a defense code selection module (DCSM) 214c.

In some embodiments, the target temperature determination module 214a, the operation parameter selection module 214b, and the defense code selection module 214c may be implemented in software, for example. When the CPU 213 executes the target temperature determination module 214a, the operation parameter selection module 214b, and the defense code selection module 214c, the storage controller 210 may perform the operation implemented in each module. However, embodiments are not limited thereto.

The target temperature determination module (TTDM) 214a may receive the temperature sensed from the temperature sensor 230 and process the sensed temperature to determine the target temperature. A detailed description of the processing of the target temperature determination module 214a will be given later.

The operation parameter selection module (OPSM) 214b may select an operation parameter corresponding to the target temperature among the operation parameters (e.g., OP1 to OPm in FIG. 4) stored in the nonvolatile memory 220 based on the target temperature determined by the target temperature determination module 214a.

The defense code selection module (DCSM) 214c may select a defense code corresponding to the target temperature among the defense codes (e.g., DC1 to DCm in FIG. 4) stored in the nonvolatile memory 220 based on the target temperature determined by the target temperature determination module 214a.

When the operation parameter and the defense code corresponding to the target temperature are selected in this way, the storage controller 210 may request the selected operation parameter and defense code from the nonvolatile memory 220, and the nonvolatile memory 220 may provide the selected operation parameter and defense code to the storage controller 210.

Figure 8:
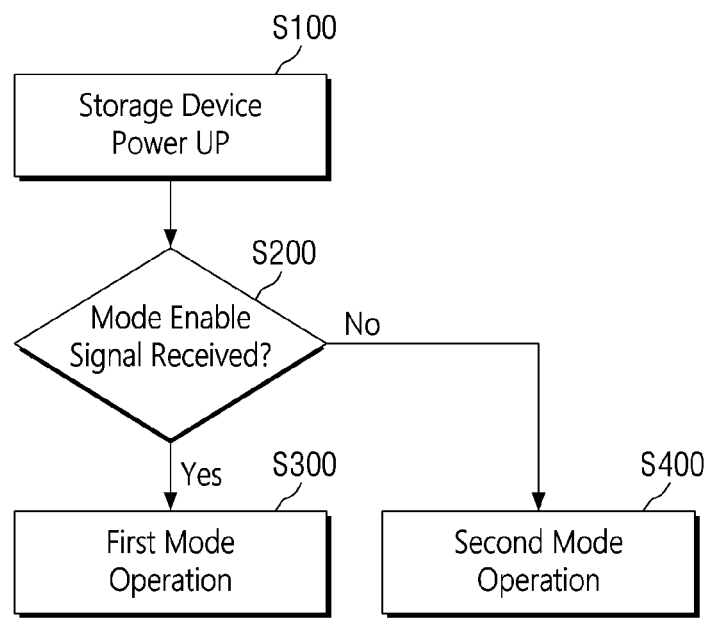
FIG. 8 is a flowchart illustrating a method of operating a storage device according to some embodiments.

FIG. 8 is a flowchart illustrating a method of operating a storage device according to some embodiments.

Referring to FIG. 8, the storage device is powered up (step S100).

Subsequently, it is checked whether a mode enable signal is received (step S200).

When the mode enable signal is received (or the signal level of the mode enable signal is the first level) (Yes in step S200), the storage device operates in a first mode (step S300). In contrast, when the mode enable signal is not received (or when the signal level of the mode enable signal is the second level) (No in step S200), the storage device operates in a second mode (step S400).

Referring to FIG. 3, in the embodiment of FIGS. 1-8, the first mode may be a mode that operates using the control information 222 for each temperature range stored in the nonvolatile memory 220 described above, and the second mode may be a mode that operates without using the control information 222 for each temperature range stored in nonvolatile memory 220.

That is, the first mode may be a mode in which a memory operation is performed using control information corresponding to the operating temperature sensed by the temperature sensor 230, and the second mode may be a mode in which a memory operation is performed irrespective of the operating temperature sensed by the temperature sensor and instead is performed according to the control information that has already been set at the time of manufacture in consideration of the operating temperature and environment of the storage device. However, the operation of the second mode is not limited thereto, and detailed operations of the second mode may be modified and implemented.

Hereinafter, the first mode operation will be described in more detail with reference to FIGS. 9 to 11.

Figure 9:
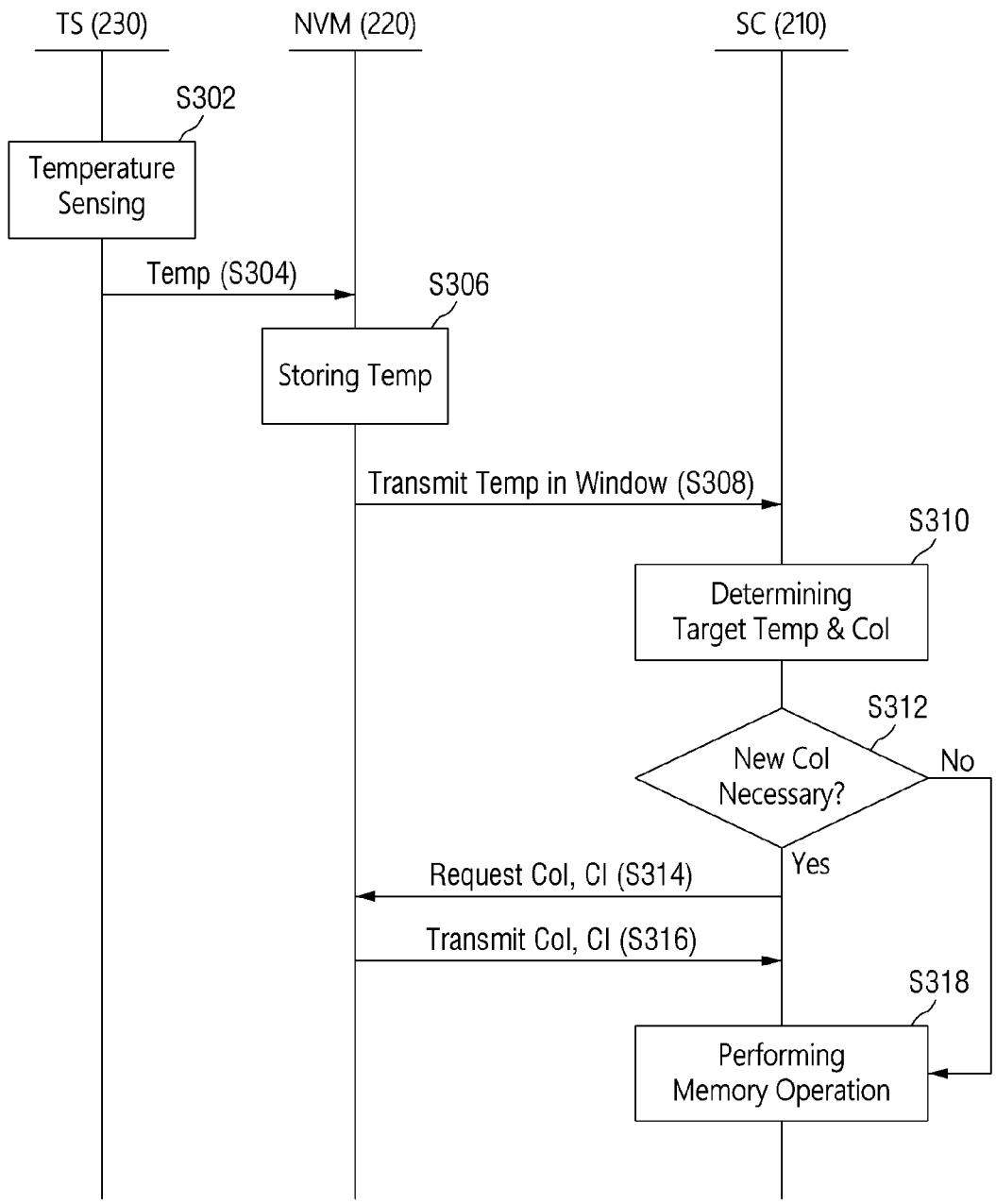
FIG. 9 is a flowchart illustrating a first mode operation of the method of FIG. 8, according to some embodiments.

FIG. 9 is a flowchart illustrating the first mode operation of the method of FIG. 8. FIG. 10 is a diagram for describing a process of determining a target temperature. FIG. 11 is a diagram for describing a memory operation performed by using compensation information.

Referring to FIG. 9, the temperature sensor 230 performs temperature sensing (step S302). For example, as illustrated in FIG. 10, the temperature sensor 230 may sense the temperature of the storage device for each sensing period SD. In some embodiments, the temperature sensor 230 may sense an ambient temperature of the storage device for each sensing period SD.

Referring back to FIG. 9, the temperature sensed by the temperature sensor 230 may be transmitted to the nonvolatile memory 220 (step S304).

Referring to FIG. 2, when the data signal DQ including temperature information is received from the storage controller 210, the memory interface circuit 212b of the nonvolatile memory 220 may receive the data strobe signal DQS toggling together with temperature information from the storage controller 210. The memory interface circuit 212b may obtain temperature information from the data signal DQ based on the toggle timing of the data strobe signal DQS. For example, the memory interface circuit 212b may obtain the temperature information by sampling the data signal DQ at the rising and falling edges of the data strobe signal DQS.

Referring to FIG. 9 again, the nonvolatile memory 220 having received the temperature information stores the received temperature information (step S306).

Referring to FIG. 3, temperature information received in a specific storage unit 220n among the plurality of storage units 220a to 220n of the nonvolatile memory 220 may be stored in the form of the temperature history 221. That is, in the specific storage unit 220n among the plurality of storage units 220a to 220n of the nonvolatile memory 220, as illustrated in FIG. 10, the sensed temperatures T1 to TP may be stored for each sensing period SD over a period P (where P is a natural number). The specific storage unit 220n may be predetermined.

Although FIG. 9 illustrates that the temperature information sensed from the temperature sensor 230 is directly stored in the nonvolatile memory 220 for convenience of understanding, this operation may be performed under the control of the storage controller 210.

Referring to FIG. 9 again, temperatures within a window are transmitted to the storage controller 210 (step S308). The window may be predetermined.

Referring to FIGS. 3 and 10, temperatures within a window denotes temperatures within a range set by the storage controller 210 among temperatures stored in the temperature history 221. The range may be predetermined. For example, when the storage controller 210 sets Q (where Q is a natural number) sensing periods SD as a window from the current time point, the temperatures sensed during the past Q sensing periods including the temperature TP at the current time point may be provided to the storage controller 210. In other words, the temperature window looks back Q sensing periods SD from the temperature TP at the current time point.

Referring to FIG. 9 again, the storage controller 210 that has received temperatures within the window processes the temperatures to determine a target temperature, and control information corresponding to the determined target temperature (step S310).

In some embodiments, processing the temperatures to determine the target temperature by the storage controller 210 that has received the temperatures within the window may include, for example, calculating a weighted moving average of the temperatures within the window and determining the calculated weighted moving average as the target temperature by the storage controller 210.

In this case, the weighted moving average St may be calculated using, for example, the following Eq. 1:

$$S_t = \begin{cases} \theta_1 & t = 1 \\ \dfrac{\beta \cdot S_{t-1} + (1 - \beta) \times \theta_t}{(1 - \beta^t)} & t > 1 \end{cases} \quad \text{Eq. 1}$$

where β may be changed with a tuning parameter. Increasing the β value makes the weighted moving average St less sensitive to temperature changes, and decreasing the β value makes the weighted moving average St more sensitive to changes in temperature values.

When the target temperature is determined in this way, the storage controller 210 may check which temperature interval of FIG. 4 the determined target temperature belongs to, and may determine control information (e.g., the operation parameter OP and the defense code DC) of the temperature interval to which the target temperature belongs.

Referring to FIG. 9 again, it is determined whether new control information CoI is necessary (step S310).

For example, referring to FIG. 4 together with FIG. 9, when the current time point is t, in a case where the target temperature determined at the time point t−1 belongs to the temperature range T0 to T1, and the target temperature determined at the current time point also belongs to the temperature range T0 to T1, the storage controller 210 does not need the new control information CoI because the operation parameter OP1 and the defense code DC1 used for a memory operation at the time point t−1 may be used (No in step S312). Accordingly, the storage controller 210 performs a memory operation using the previously used operation parameter and the defense code (step S318).

However, in a case where the target temperature determined at the time point t−1 belongs to the temperature range T0 to T1 but the target temperature determined at the current time point belongs to the temperature range T1 to T2, the storage controller 210 may not use the operation parameter OP1 and defense code DC1 that have been used for the memory operation at the time point t−1, for the memory operation at the current time point. Rather, it is necessary to compensate for the memory operation according to the temperature range change (transition). Accordingly, this case is a case where the new control information CoI is necessary (Yes in step S312).

When such new control information CoI is necessary, the storage controller 210 requests the new control information CoI and the compensation information CI from the nonvolatile memory 220 (step S314). In response thereto, the nonvolatile memory 220 transmits the new control information CoI and the compensation information CI to the storage controller 210 (step S316).

Referring to FIG. 2, for example, the memory interface circuit 212b may generate the data strobe signal DQS that starts toggling after a delay (e.g., tDQSRE) based on the toggling start time of the read enable signal nRE. The delay may be predetermined. The memory interface circuit 212b may transmit the data signal DQ including the new control information CoI and the compensation information CI based on a toggle timing of the data strobe signal DQS. Accordingly, the new control information CoI and the compensation information CI may be aligned with the toggle timing of the data strobe signal DQS and transmitted to the storage controller 210.

The storage controller 210, which has been provided with the new control information CoI and the compensation information CI, uses the new control information CoI (e.g., new operation parameters and defense codes) and the compensation information CI to perform the memory operation (step S318).

The operation described above will be described using the example illustrated in FIG. 11 as follows.

Figure 11:
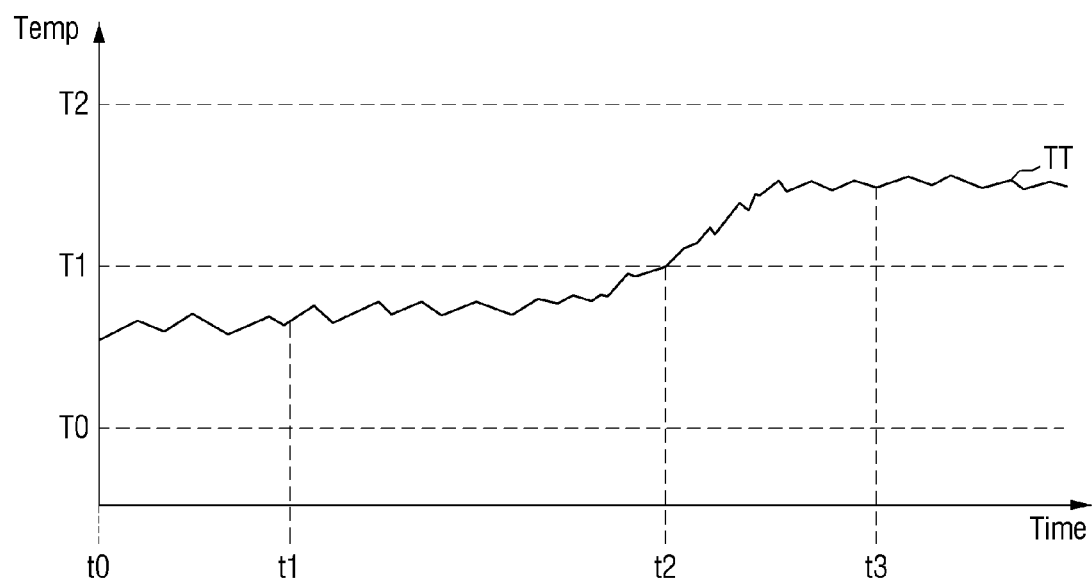
FIG. 11 is a diagram for describing a memory operation performed by using compensation information, according to some embodiments.

Referring to FIGS. 4, 6A and 11, at the time point t1, the calculated target temperature TT belongs to the interval T0 to T1, and even before the time point t1, the calculated target temperature TT belongs to the interval T0 to T1. Accordingly, the storage controller may perform a memory operation using the operation parameter OP1 and the defense code DC1.

At the next time point t2, the calculated target temperature TT belongs to the interval T1 to T2. However, before the time point t2, the calculated target temperature TT has belonged to the interval T0 to T1. Accordingly, the storage controller may read the operation parameter OP2, the defense code DC2, and the compensation information CI1 from the nonvolatile memory, and may perform a memory operation using the operation parameter OP2, the defense code DC2, and the compensation information CI1 that have been read.

At the next time point t3, the calculated target temperature TT belongs to the interval T1 to T2, and even before the time point t3, the calculated target temperature TT belongs to the interval T1 to T2. Accordingly, the storage controller may perform a memory operation using the operation parameter OP2, the defense code DC2, and the compensation information CI1. That is, the storage controller does not need to read new information.

Figure 12:
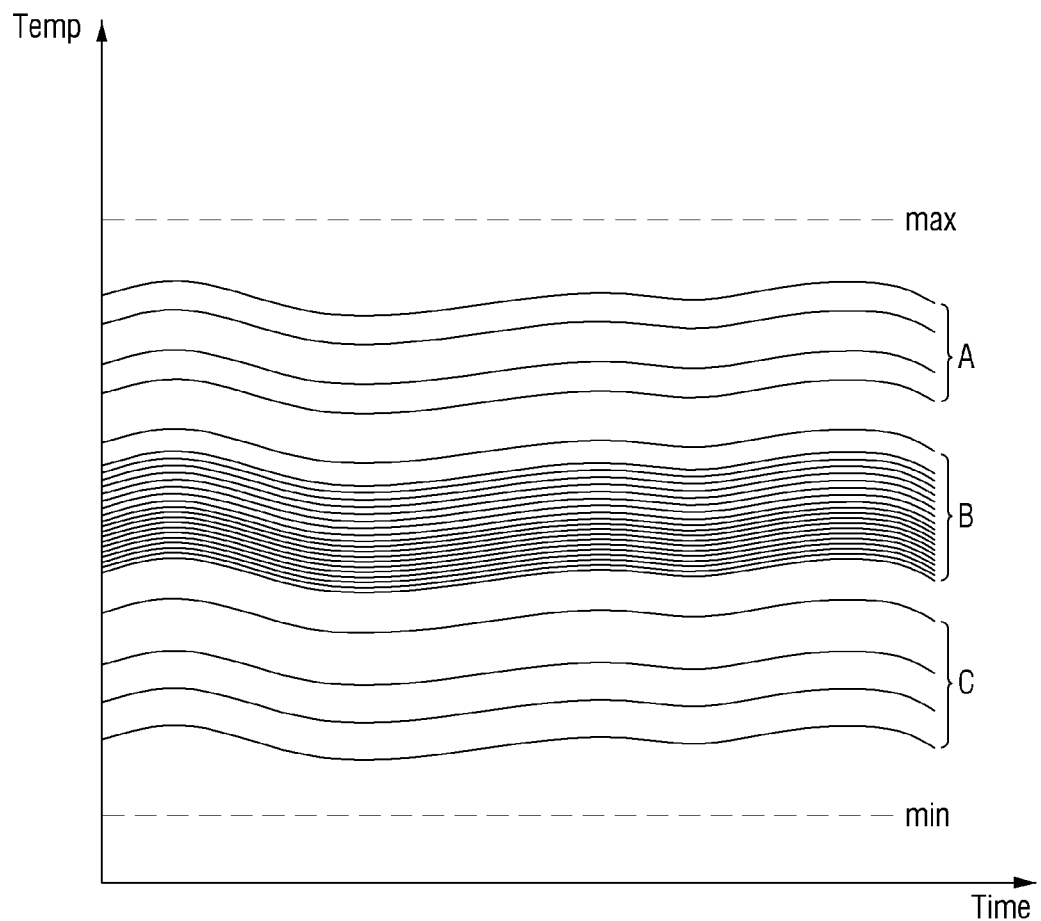
FIG. 12 is a diagram for describing an effect of a storage device according to some embodiments.

FIG. 12 is a diagram for describing an effect of a storage device according to some embodiments.

FIG. 12 is a graph illustrating changes in operating temperature over time of storage devices installed and used in a data center. As illustrated in FIG. 12, it has been observed that the operating temperature of the storage devices does not change significantly over time unlike the expectation, and the operating temperature maintains a constant temperature range over time that is different depending on the position in the server or depending on the server manufacturer.

That is, a storage device C that has been operated at a first position having a low temperature (e.g., 15° C. to 20° C.) environment has been continuously operated in a low temperature environment, and a storage device A that has been operated at a second position having a high temperature (e.g., 75° C. to 80° C.) environment has been continuously operated in a high temperature environment. In addition, the operating temperature of a storage device B, which has been operated at a third position having an environment between low temperature and high temperature, also does not change significantly.

In general, the control information used for the memory operation of the storage device, at the manufacturing stage of the storage device, is set to exhibit at least average performance even in a position within the server that has an extreme environment, assuming that the operating temperature of the storage device randomly changes within the range of, for example, 15° C. to 80° C.

However, when the control information is set and the memory operation is performed in this way, in the operating environment as illustrated in FIG. 12, all of the storage devices A, B, and C do not exhibit optimal performance although control information for each of the storage devices A, B, and C to exhibit optimal performance exists.

Accordingly, in the embodiment of FIGS. 1-11, the storage controller 210 performs the memory operation using control information (e.g., the operation parameter OP and the defense code DC) that may exhibit optimal performance in the temperature interval to which the determined target temperature belongs, so that the operating performance of the storage device may be improved.

Figure 13:
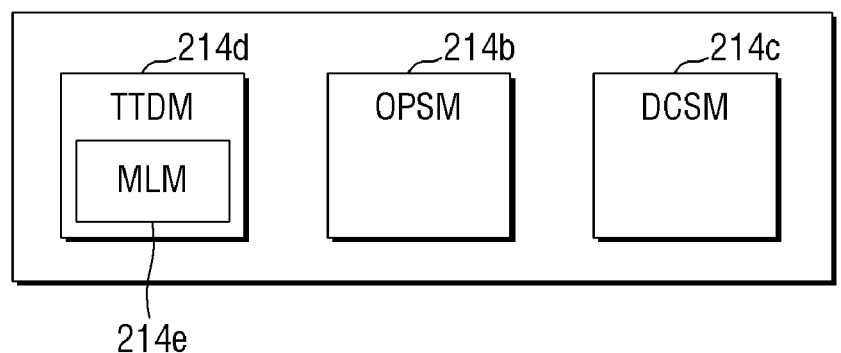
FIG. 13 is a diagram illustrating a storage device according to some other embodiments.
Figure 14:
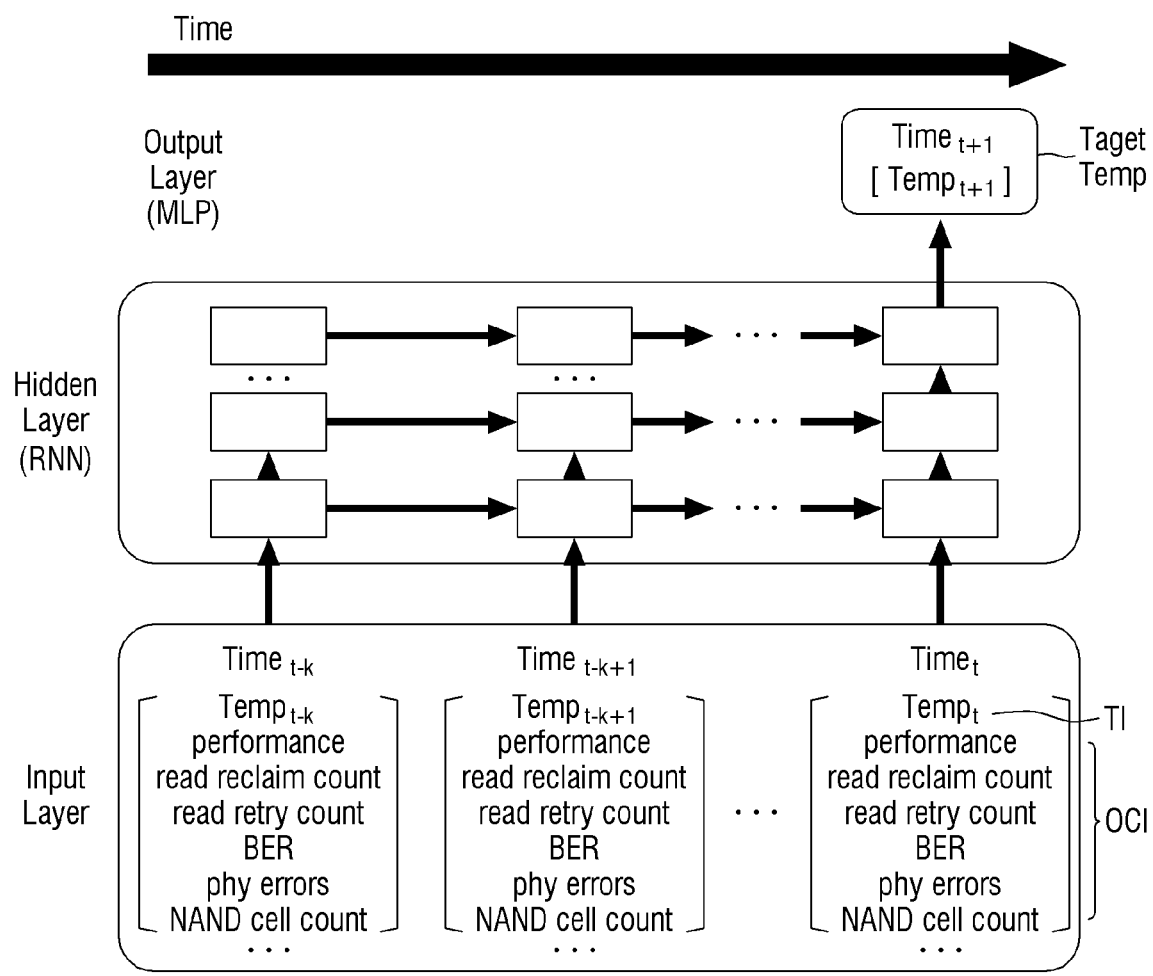
FIG. 14 is a diagram for describing a machine learning module of the storage device FIG. 13.

FIG. 13 is a diagram illustrating a storage device according to some other embodiments. FIG. 14 is a diagram for describing a machine learning module of the storage device of FIG. 13.

Hereinafter, like reference numerals refer to like components and a redundant description of the embodiment of FIGS. 1-12 will be omitted for conciseness, and differences will be mainly described.

Referring to FIG. 13, a target temperature determination module 214d of the flash translation layer 214 of the storage controller 210 of FIG. 1 may include a machine learning module (MLM) 214e.

In some embodiments, the target temperature determination module 214d and machine learning module 214e may be implemented in software, for example. The storage controller 210 of FIG. 1 may perform an operation implemented in each module by the CPU 213 of FIG. 1 executing the target temperature determination module 214d and the machine learning module 214e. However, embodiments are not limited thereto.

The machine learning module (MLM) 214e may perform machine learning based on the temperatures that are sensed from the temperature sensor 230 in FIG. 1 and stored in the temperature history 221, to predict the operating temperature of the storage device at a future time point. Further, the target temperature determination module 214d may determine the target temperature described above through a processing process for the prediction temperature. The processing process may be predetermined.

In some embodiments, the machine learning module (MLM) 214e may perform machine learning based on not only the temperatures stored in the temperature history 221 but also the operating characteristic information of the nonvolatile memory 220 in FIG. 1 according to the temperatures, to predict the operating temperature of the storage device at the future time point. That is, the input received by the machine learning module 214e to calculate the operation prediction temperature may include the operating characteristic information of the nonvolatile memory 220 in FIG. 1 according to the past operating temperatures and temperatures stored in the temperature history 221.

Specifically, referring to FIGS. 13 and 14, the machine learning module (MLM) 214e may include an input layer, a hidden layer, and an output layer.

As the input layer, learning data Time for each time point from the past time point k to the current time point t described above may be provided. The learning data Time at each time point may include operation temperature information TI of the storage device and operation characteristic information OCI of the nonvolatile memory at the corresponding operation temperature.

The learning data Time of the input layer may be provided to the hidden layer to be learned. In the embodiment illustrated in FIGS. 13-14, a recurrent neural network (RNN) model capable of precise prediction by receiving time-series features as a hidden layer may be applied, but embodiments are not limited thereto.

When the learning is completed, a prediction operating temperature at a time point t+1, which is a future time point of the current time point t, may be calculated as an output layer. The output layer may use a multi-layer perceptron (MLP), but embodiments are not limited thereto.

Hereinafter, operations of the storage device according to some other embodiments will be described with reference to FIGS. 9, 15 and 16.

Figure 15:
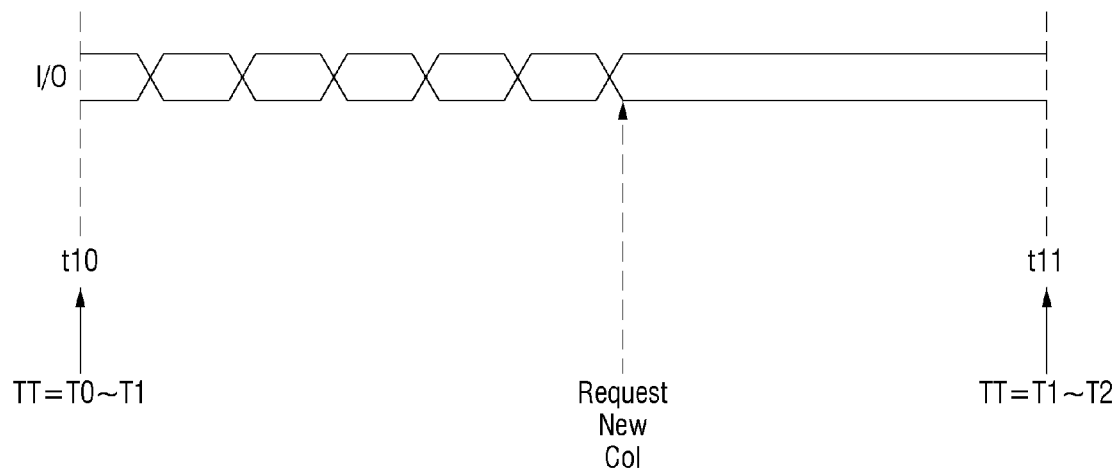
FIGS. 15 and 16 are diagrams for describing an operation of a storage device according to some other embodiments.
Figure 16:
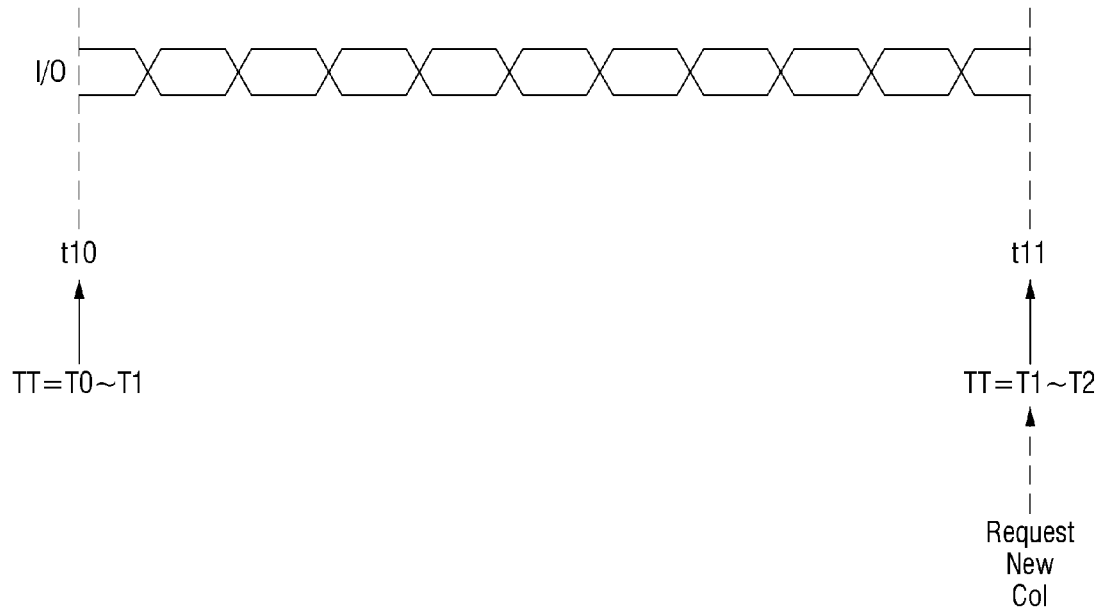

FIGS. 15 and 16 are diagrams for describing an operation of a storage device according to some other embodiments.

In the storage device according to the embodiment of FIGS. 15-16, the target temperature determined in the step S310 of FIG. 9 is not the current operating temperature but the operating temperature at a future time point.

Accordingly, when the new control information CoI is necessary according to the determined target temperature (Yes in step S312), the new control information CoI is not immediately necessary as in the embodiment illustrated in FIG. 9.

Accordingly, the storage controller 210 may request the nonvolatile memory 220 for the control information CoI corresponding to the target temperature in consideration of an input/output (I/O) command provided to the storage controller 210.

Specifically, referring to FIG. 15, suppose that the storage device that operates in the temperature interval T0 to T1 as the target temperature TT predicts that the target temperature TT of the future time point t11 from the current time point t10 is the temperature interval T1 to T2. In this case, the storage controller only needs to receive the control information CoI corresponding to the temperature interval T1 to T2 before the time point t11.

When, as in the example illustrated in FIG. 15, there is an interval in which the I/O command is stopped between the time point t10 and the time point t11, the storage controller may request new control information CoI from the nonvolatile memory during the interval in which the I/O command is stopped.

However, as in the example illustrated in FIG. 16, when there is no interval in which the I/O command is stopped between the time point t10 and the time point t11, the storage controller may request new control information CoI from the nonvolatile memory at the time point t11.

Figure 17:
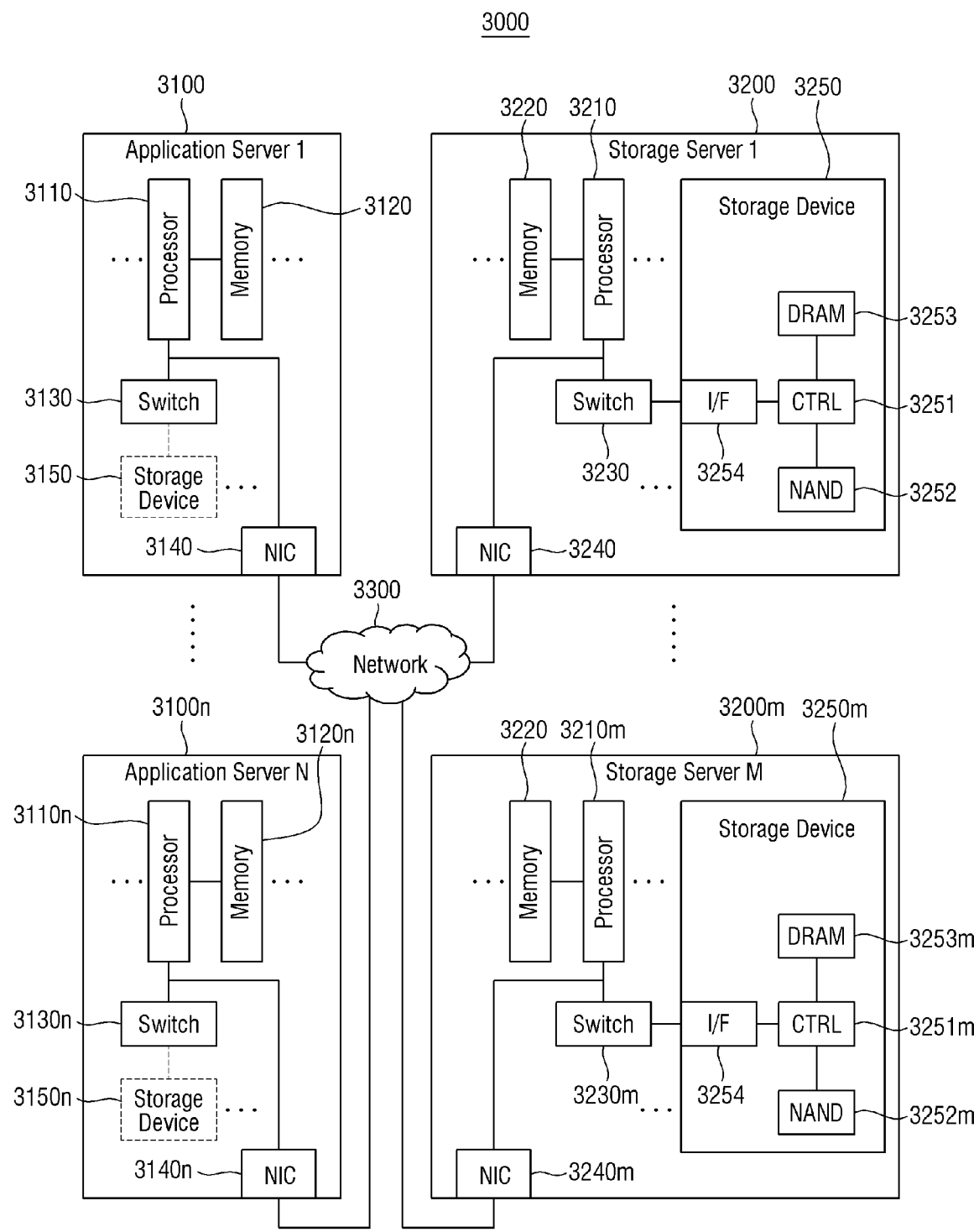
FIG. 17 is a diagram illustrating a data center to which a storage assembly according to some embodiments is applied.

FIG. 17 is a diagram illustrating a data center to which a storage assembly according to some embodiments is applied.

Referring to FIG. 17, a data center 3000 is a facility that collects various types of data and provides services, and may be referred to as a data storage center. The data center 3000 may be a system for operating a search engine and a database, and may be a computing system used by a company such as a bank or a government institution. The data center 3000 may include application servers 3100 to 3100n and storage servers 3200 to 3200m. The number of application servers 3100 to 3100n and the number of storage servers 3200 to 3200m may be variously selected according to embodiments, and the number of application servers 3100 to 3100n and the number of storage servers 3200 to 3200m may be different from each other.

The application server 3100 may include at least one processor 3110 and at least one memory 3120. Similarly, the storage server 3200 may include at least one processor 3210 and at least one memory 3220. When describing the storage server 3200 as an example, the processor 3210 may control the overall operation of the storage server 3200, and access the memory 3220 to execute commands and/or data loaded in the memory 3220. The memory 3220 may be double data rate synchronous DRAM (DDR SDRAM), high bandwidth memory (HBM), hybrid memory cube (HMC), dual in-line memory module (DIMM), optane DIMM or nonvolatile DIMM (NVMDIMM). Depending on the embodiment, the number of processors 3210 and the number of memories 3220 included in the storage server 3200 may be variously selected.

In some embodiments, the processor 3210 and the memory 3220 may provide a processor-memory pair. In some embodiments, the number of processors 3210 and the number of memories 3220 may be different from each other. The processor 3210 may include a single core processor or a multiple core processor. The description of the storage server 3200 may be similarly applied to the application server 3100. Depending on the embodiment, the application server 3100 may omit the storage device 3150. The storage server 3200 may include at least one storage device 3250. The number of storage devices 3250 included in the storage server 3200 may be variously selected according to the embodiment.

The application servers 3100 to 3100n and the storage servers 3200 to 3200m may communicate with each other through the network 3300. The network 3300 may be implemented using fiber channel (FC) or Ethernet or the like. In this case, FC is a medium used for relatively high-speed data transmission, and an optical switch that provides high performance/high availability may be used. The storage servers 3200 to 3200m may be provided as a file storage, a block storage, or an object storage according to an access method of the network 3300.

In some embodiments, the network 3300 may be a storage-only network such as a storage area network (SAN). For example, the SAN may be an FC-SAN that uses an FC network and is implemented according to the FC protocol (FCP). For another example, the SAN may be an IP-SAN that uses a TCP/IP network and is implemented according to an iSCSI (SCSI over TCP/IP or Internet SCSI) protocol. In other embodiments, a network 1300 may be a general network such as a TCP/IP network. For example, the network 1300 may be implemented according to protocols such as FC over Ethernet (FCoE), network attached storage (NAS), and NVMe over fabrics (NVMe-oF).

Hereinafter, a description will be given focusing on the application server 3100 and the storage server 3200. The description of the application server 3100 may be applied to the other application server 3100n, and the description of the storage server 3200 may be applied to the other storage server 3200m.

The application server 3100 may store data requested to be stored by a user or a client in one of the storage servers 3200 to 3200m through the network 3300. In addition, the application server 3100 may acquire data requested to be read by a user or a client from one of the storage servers 3200 to 3200m through the network 3300. For example, the application server 3100 may be implemented as a web server or a database management system (DBMS), or the like.

The application server 3100 may access the memory 3120n or the storage device 3150n included in the other application server 3100n through the network 3300, or may access the memories 3220 to 3220m or the storage devices 3250 to 3250m included in the storage servers 3200 to 3200m through the network 3300. Accordingly, the application server 3100 may perform various operations on data stored in the application servers 3100 to 3100n and/or the storage servers 3200 to 3200m. For example, the application server 3100 may execute a command for moving or copying data between the application servers 3100 to 3100n and/or the storage servers 3200 to 3200m. At this time, the data may be moved from the storage devices 3250 to 3250m of the storage servers 3200 to 3200m, to the memories 3120 to 3120n of the application servers 3100 to 3100n, either through the memories 3220 to 3220m of the storage servers 3200 to 3200m or directly. The data moving through the network 3300 may be encrypted data for security or privacy.

Referring to the storage server 3200 as an example, an interface (I/F) 3254 may provide a physical connection between the processor 3210 and a controller 3251 and a physical connection between a network interface controller (NIC) 3240 and the controller 3251. For example, the interface 3254 may be implemented in a direct attached storage (DAS) method in which the storage device 3250 is directly connected with a dedicated cable. In addition, for example, the interface 3254 may be implemented as various types of interfaces, such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), and compact flash (CF) card.

The storage server 3200 may further include a switch 3230 and the NIC 3240. The switch 3230 may selectively connect the processor 3210 to the storage device 3250 or may selectively connect the NIC 3240 to the storage device 3250 under the control of the processor 3210.

In some embodiments, the NIC 3240 may include a network interface card, a network adapter, or the like. The NIC 3240 may be connected to the network 3300 through a wired interface, a wireless interface, a Bluetooth interface, an optical interface, or the like. The NIC 3240 may include an internal memory, a DSP, a host bus interface, or the like, and may be connected to the processor 3210 and/or the switch 3230, or the like through a host bus interface. The host bus interface may be implemented as one of the examples of the interface 3254 described above. In some embodiments, the NIC 3240 may be integrated with at least one of the processor 3210, the switch 3230, and the storage device 3250.

In the storage servers 3200 to 3200m or the application servers 3100 to 3100n, the processor may send a command to the storage devices 3130 to 3130n, 3250 to 3250m or the memories 3120 to 3120n, 3220 to 3220m to program or read data. In this case, the data may be data that has been error-corrected through an error correction code (ECC) engine. The data may be data that has been processed by data bus inversion (DBI) or data masking (DM), and may include cyclic redundancy code (CRC) information. The data may be encrypted data for security or privacy.

The storage devices 3150 to 3150m and 3250 to 3250m may transmit a control signal and a command/address signal to NAND flash memory devices 3252 to 3252m in response to a read command received from the processor. Accordingly, when data is read from the NAND flash memory device 3252 to 3252m, a read enable (RE) signal may serve to be inputted as a data output control signal and to output data to the DQ bus. The data strobe signal (DQS) may be generated by using the RE signal. The command and address signals may be latched in the page buffer according to the rising edge or falling edge of a write enable (WE) signal.

The controller 3251 may overall control the operation of the storage device 3250. In some embodiments, the controller 3251 may include a static random access memory (SRAM). The controller 3251 may write data to the NAND flash 3252 in response to a write command, or read data from the NAND flash 3252 in response to a read command. For example, the write command and/or the read command may be provided from the processor 3210 in the storage server 3200, the processor 3210*m* in another storage server 3200*m*, or the processors 3110 and 3110*n* in the application servers 3100 and 3100*n*. The DRAM 3253 may temporarily store (buffer) data to be written to the NAND flash 3252 or data read from the NAND flash 3252. In addition, the DRAM 3253 may store metadata. Here, the metadata may be data generated by the controller 3251 to manage the user data or the NAND flash 3252. The storage device 3250 may include a secure element (SE) for security or privacy.

In some embodiments, the storage device 3250 of the storage server 3200 to the storage device 3250*m* of the storage server 3200*m* may employ the storage devices described above.

However, the storage device 3250 may continue to be operated in a first temperature range due to the mounting position thereof, the disposition shape of the storage server 3200, or the like, and the storage device 3250*m* may continue to be operated in a second temperature range different from the first temperature range due to the mounting position thereof, the disposition shape of the storage server 3200*m*, or the like. In this case, although the first control information and the second control information are stored in the nonvolatile memory of the storage device 3250, the storage device 3250 may continue to operate using the first control information, and although the first control information and the second control information are also stored in the nonvolatile memory of the storage device 3250*m*, the storage device 3250*m* may continue to operate using the second control information.

In addition, the storage device 3250 mounted at the first position of the storage server 3200 and the storage device 3250 mounted at the second position of the storage server 3200 may also continue to operate in different temperature ranges due to the dispositions thereof or the like. Even in this case, although the first control information and the second control information are stored in the nonvolatile memory of the storage device 3250 mounted at the first position of the storage server 3200, the storage device 3250 mounted at the first position of the storage server 3200 may continue to operate using the first control information, and although the first control information and the second control information are also stored in the nonvolatile memory of the storage device 3250 mounted at the second position of the storage server 3200, the storage device 3250 mounted at the second position of the storage server 3200 may continue to operate using the second control information.

Those skilled in the art will appreciate that many variations and modifications may be made to the embodiments without substantially departing from the principles of the present disclosure. Therefore, the disclosed embodiments of the disclosure are used in a generic and descriptive sense only and not for purposes of limitation.

What is claimed is:

1. A method of operating a storage device, the method comprising:
providing a nonvolatile memory configured to store first control information related to a first temperature range and second control information related to a second temperature range different from the first temperature range;
receiving a temperature sensed from a temperature sensor;
determining a target temperature by processing the temperature;
selecting one of the first control information and the second control information based on the target temperature; and
performing a memory operation on the nonvolatile memory using the one of the first control information and the second control information,
wherein the first control information includes:
an operation parameter of the memory operation performed in the first temperature range; and
a defense code including a read-retry algorithm for optimizing the memory operation performed in the first temperature range, and
wherein the method further comprises:
receiving a mode enable signal,
wherein the storage device operates in a first mode in which the memory operation is performed on the nonvolatile memory using the first control information and the second control information in response to a first mode enable signal, and
wherein the storage device, in response to a second mode enable signal different from the first mode enable signal, performs the memory operation on the nonvolatile memory according to pre-set temperature control information that has been set in consideration of an operating temperature and environment of the storage device without using the first control information and the second control information.

2. The method of claim 1, wherein the selecting of one of the first control information and the second control information based on the target temperature comprises requesting the one of the first control information and the second control information corresponding to the target temperature from the nonvolatile memory.

3. The method of claim 1, wherein the determining of the target temperature by processing the temperature comprises calculating a weighted moving average of temperatures within a window among a plurality of sensed temperatures, and determining the target temperature based on the weighted moving average.

4. The method of claim 1, wherein the determining of the target temperature by processing the temperature comprises calculating a prediction temperature at a future time by performing machine learning based on historic sensed temperatures, and determining the target temperature based on the prediction temperature.

5. The method of claim 1, wherein the pre-set temperature control information has been set at a time of manufacture of the storage device.

6. A storage device comprising:
a temperature sensor;
a nonvolatile memory configured to store first control information related to a first temperature range and second control information related to a second temperature range different from the first temperature range; and
a storage controller configured to receive a temperature sensed from the temperature sensor, determine a target temperature by processing the temperature, select one of the first control information and the second control information based on the target temperature, and perform a memory operation on the nonvolatile memory using the one of the first control information and the second control information, wherein the first control information includes:
an operation parameter of the memory operation performed in the first temperature range; and
a defense code including a read-retry algorithm for optimizing the memory operation performed in the first temperature range, and wherein in a first mode, the storage controller performs the memory operation on the nonvolatile memory using one of the first control information and the second control information, and in a second mode different from the first mode, the storage controller performs the memory operation on the nonvolatile memory according to pre-set temperature control information that has been set in consideration of an operating temperature and environment of the storage device, irrespective of the temperature sensed by the temperature sensor.

7. The storage device of claim 6, wherein the memory operation includes one or more of:
a read operation of reading data stored in the nonvolatile memory;
a write operation of writing data to the nonvolatile memory; and
an erase operation of erasing at least a part of the nonvolatile memory.

8. The storage device of claim 6, wherein the nonvolatile memory further stores a transition compensation table for a transition from the first temperature range to the second temperature range, the transition compensation table including compensation information including offset values for the operation parameter and the defense code, and
the storage controller performs the memory operation on the nonvolatile memory based on the compensation information in the transition compensation table in response to the target temperature being changed from the first temperature range to the second temperature range.

9. The storage device of claim 8, wherein in response to the target temperature being changed from the first temperature range to the second temperature range, the storage controller performs the memory operation on the nonvolatile memory using the second control information and the compensation information stored in the transition compensation table.

10. The storage device of claim 6, wherein the nonvolatile memory generates a data strobe signal, and
the nonvolatile memory transmits a data signal including control information selected by the storage controller, to the storage controller, based on a toggle timing of the data strobe signal.

11. The storage device of claim 6, wherein the storage controller calculates a weighted moving average of temperatures within a window among a plurality of sensed temperatures received from the temperature sensor, and determines the target temperature based on the weighted moving average.

12. The storage device of claim 6, wherein the storage controller calculates a prediction temperature at a future time by performing machine learning based on historic sensed temperatures, and determines the target temperature at the future time based on the prediction temperature.

13. The storage device of claim 12, wherein the storage controller calculates the prediction temperature by performing machine learning based on the historic sensed temperatures and operating characteristic information of the nonvolatile memory at the historic sensed temperatures, and determines the target temperature at the future time based on the prediction temperature.

14. The storage device of claim 12, wherein the storage controller requests control information corresponding to the target temperature from the nonvolatile memory based on whether an input/output (I/O) command provided to the storage controller is stopped.

15. The storage device of claim 6, wherein the pre-set temperature control information has been set at a time of manufacture of the storage device.

16. A server device comprising:
a first storage device disposed at a first position within the server device and including a first nonvolatile memory;
a second storage device disposed at a second position within the server device different from the first position and including a second nonvolatile memory; and
a first storage server including at least one of the first storage device and the second storage device,
wherein the first storage device receives first control information related to a first temperature range and second control information related to a second temperature range different from the first temperature range,
the first storage device includes a first storage controller configured to select one of the first control information and the second control information, and perform a memory operation on the first nonvolatile memory using the one of the first control information and the second control information selected by the first storage controller,
the second storage device includes a second storage controller configured to receive the first control information and the second control information, select one of the first control information and the second control information, and perform a memory operation on the second nonvolatile memory using the one of the first control information and the second control information selected by the second storage controller,
the first storage controller performs the memory operation on the first nonvolatile memory using the first control information, and
the second storage controller performs the memory operation on the second nonvolatile memory using the second control information,
wherein the first control information includes:
an operation parameter of the memory operation performed in the first temperature range; and
a defense code including a read-retry algorithm for optimizing the memory operation performed in the first temperature range, and
wherein in a first mode, the first storage controller performs the memory operation on the first nonvolatile memory using the first control information and the second storage controller performs the memory operation on the second nonvolatile memory using the second control information, and in a second mode different from the first mode, the first storage controller performs the memory operation on the first nonvolatile memory and the second storage controller performs the memory operation on the second nonvolatile memory according to pre-set temperature control information that has been set in consideration of an operating temperature and environment of the first storage device, irrespective of the first control information and the second control information.

17. The server device of claim 16, further comprising a second storage server connected to the first storage server through a network,
wherein the first storage device is included in the first storage server,
the second storage device is included in the second storage server,
the first storage controller receives a temperature sensed from a temperature sensor, processes the temperature to determine a first target temperature, and selects the first control information based on the first target temperature, and
the first storage controller calculates a weighted moving average of temperatures within a window among a plurality of sensed temperatures received from the temperature sensor, and determines the first target temperature based on the weighted moving average.

18. The server device of claim 16, wherein the first storage device and the second storage device are included in the first storage server,
the first storage controller receives a temperature sensed from a temperature sensor, processes the temperature to determine a first target temperature, and selects the first control information based on the first target temperature, and
the first storage controller calculates a weighted moving average of temperatures within a window among a plurality of sensed temperatures received from the temperature sensor, and determines the first target temperature based on the weighted moving average.

19. The server device of claim 18, wherein the first storage controller calculates a prediction temperature at a future time by performing machine learning based on the plurality of sensed temperatures, and determines the first target temperature at the future time based on the prediction temperature.

20. The server device of claim 16, wherein the pre-set temperature control information has been set at a time of manufacture of the first storage device.

* * * * *